(12) United States Patent
Delalleau et al.

(10) Patent No.: US 12,051,656 B2
(45) Date of Patent: Jul. 30, 2024

(54) INTEGRATED CIRCUIT CONTAINING A DECOY STRUCTURE

(71) Applicant: STMicroelectronics (Rousset) SAS, Rousset (FR)

(72) Inventors: Julien Delalleau, Marseilles (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 25 days.

(21) Appl. No.: 18/095,136

(22) Filed: Jan. 10, 2023

(65) Prior Publication Data

US 2023/0163083 A1 May 25, 2023

Related U.S. Application Data

(62) Division of application No. 17/014,058, filed on Sep. 8, 2020, now Pat. No. 11,581,270, which is a division
(Continued)

(30) Foreign Application Priority Data

Jul. 21, 2017 (FR) ...................................... 1756939

(51) Int. Cl.
*H01L 23/528* (2006.01)
*H01L 21/3205* (2006.01)
(Continued)

(52) U.S. Cl.
CPC ...... *H01L 23/573* (2013.01); *H01L 21/32053* (2013.01); *H01L 21/32133* (2013.01); *H01L 21/823437* (2013.01); *H01L 21/823475* (2013.01); *H01L 21/823481* (2013.01); *H01L 23/528* (2013.01); *H01L 27/0207* (2013.01); *H01L 27/088* (2013.01); *H01L 29/0649* (2013.01); *H01L 29/0847* (2013.01); *H01L 29/1079* (2013.01); *H01L 29/45* (2013.01); *H01L 29/4916* (2013.01)

(58) Field of Classification Search
None
See application file for complete search history.

(56) References Cited

U.S. PATENT DOCUMENTS

| | | |
|---|---|---|
| 4,392,150 A | 7/1983 | Courreges |
| 5,973,375 A | 10/1999 | Baukus et al. |

(Continued)

FOREIGN PATENT DOCUMENTS

| | | |
|---|---|---|
| TW | 502384 B | 9/2002 |
| WO | 9857373 A1 | 12/1998 |
| WO | 03098692 A1 | 11/2003 |

OTHER PUBLICATIONS

First Office Action and Search Report for counterpart CN Appl. No. 201810766009.1, report dated Aug. 19, 2022, 7 pgs.
(Continued)

*Primary Examiner* — Bilkis Jahan
(74) *Attorney, Agent, or Firm* — Crowe & Dunlevy LLC

(57) ABSTRACT

An integrated circuit includes a substrate, an interconnection part, and an isolating region located between the substrate and the interconnection part. A decoy structure is located within the isolating region and includes a silicided sector which is electrically isolated from the substrate.

15 Claims, 10 Drawing Sheets

Related U.S. Application Data of application No. 16/036,639, filed on Jul. 16, 2018, now Pat. No. 10,804,222.

(51) Int. Cl.
*H01L 21/3213* (2006.01)
*H01L 21/8234* (2006.01)
*H01L 23/00* (2006.01)
*H01L 27/02* (2006.01)
*H01L 27/088* (2006.01)
*H01L 29/06* (2006.01)
*H01L 29/08* (2006.01)
*H01L 29/10* (2006.01)
*H01L 29/45* (2006.01)
*H01L 29/49* (2006.01)

(56) References Cited

U.S. PATENT DOCUMENTS

| | | | |
|---|---|---|---|
| 7,479,683 B2 | 1/2009 | Bojarczuk, Jr. et al. | |
| 8,338,909 B2* | 12/2012 | Fung | H01L 21/84 |
| | | | 438/164 |
| 9,343,468 B1* | 5/2016 | Bo | G11C 16/0425 |
| 2002/0173131 A1 | 11/2002 | Clark, Jr. et al. | |
| 2003/0052388 A1 | 3/2003 | Mheen et al. | |
| 2003/0214002 A1 | 11/2003 | Chow et al. | |
| 2004/0099912 A1 | 5/2004 | Chow et al. | |
| 2004/0159886 A1* | 8/2004 | Lee | H10B 41/46 |
| | | | 257/E21.687 |
| 2005/0269634 A1 | 12/2005 | Bojarczuk, Jr. et al. | |
| 2005/0269635 A1 | 12/2005 | Bojarczuk, Jr. et al. | |
| 2005/0272256 A1 | 12/2005 | Wang | |
| 2007/0108471 A1* | 5/2007 | Oishi | H01L 29/7843 |
| | | | 257/E21.627 |
| 2008/0023774 A1 | 1/2008 | Sato et al. | |
| 2008/0311718 A1* | 12/2008 | Futase | H01L 21/28556 |
| | | | 438/296 |
| 2010/0072523 A1 | 3/2010 | Sato et al. | |
| 2010/0224942 A1* | 9/2010 | Lim | H01L 29/0649 |
| | | | 257/384 |
| 2011/0095348 A1* | 4/2011 | Chakihara | H01L 29/0649 |
| | | | 257/E29.345 |
| 2012/0056245 A1* | 3/2012 | Kang | H01L 21/0262 |
| | | | 257/192 |
| 2016/0163861 A1 | 6/2016 | Park et al. | |
| 2016/0197616 A1 | 7/2016 | Cocchi et al. | |
| 2017/0062558 A1* | 3/2017 | Pickelsimer | H01L 21/2253 |

OTHER PUBLICATIONS

INPI Search Report and Written Opinion for FR 1756939 dated May 18, 2018 (14 pages).

* cited by examiner

INTEGRATED CIRCUIT CONTAINING A DECOY STRUCTURE

CROSS REFERENCE TO RELATED APPLICATIONS

This application is a divisional of U.S. application for patent Ser. No. 17/014,058 filed Sep. 8, 2020, which is a divisional of U.S. application for patent Ser. No. 16/036,639 filed Jul. 16, 2018, now U.S. Pat. No. 10,804,222, which claims the priority benefit of French Application for Patent No. 1756939, filed on Jul. 21, 2017, the content of which is hereby incorporated by reference in its entirety to the maximum extent allowable by law.

TECHNICAL FIELD

The invention relates to integrated circuits, and more particularly to those incorporating one or more decoy structures, that is to say a structure which has, in an image viewed from above, using a scanning electron microscope (SEM) for example, the appearance of a certain component such as a conventional transistor, but in reality acts as another component, for example a resistor or a transistor that is inoperative or always closed or always open.

There is a need to incorporate one or more decoy structures into an integrated circuit, notably in order to make it even more difficult to reverse engineer the circuit.

SUMMARY

According to one application and embodiment, therefore, what is proposed is an integrated circuit whose decoy structure is also simple to construct and has little or no effect on neighboring components.

According to one aspect, an integrated circuit is proposed, containing a substrate, an interconnection part more commonly known to those skilled in the art under the acronym BEOL (Back End Of Line), and an isolating region located between the substrate and the interconnection part, this isolating region comprising a nitride layer, for example, more commonly known to those skilled in the art under the English acronym CESL (Contact Etch Stop Layer), surmounted by a dielectric layer, also known to those skilled in the art under the acronym PMD (Pre-Metal Dielectric).

The integrated circuit also comprises at least one decoy structure located within the isolating region and having a silicided sector electrically isolated from the substrate.

Thus, when viewed from above, the silicided sector appears to actually be a silicided sector, for example a source area or a drain area or any silicided substrate area, but, in fact, there is no electrical contact between this silicided sector and the underlying substrate, since the silicided sector is electrically isolated from the underlying substrate.

The structure comprising this silicided sector electrically isolated from the substrate therefore acts as a decoy structure.

There are various possible embodiments of this decoy structure and this silicided sector.

Thus, according to a variant in which the substrate comprises substrate areas delimited by isolating domains such as those of the shallow trench type (STI: Shallow Trench Isolation), said isolating region covers the substrate areas and the isolating domains, and the decoy structure comprises: the silicided sector, a first isolating layer separating the silicided sector from a first substrate area, and a first stud adapted to be electrically conductive, commonly known to those skilled in the art by the term "contact", having a first end in contact with said silicided sector and a second end electrically coupled to said interconnection part.

According to a possible embodiment of such a variant, said decoy structure comprises: an isolated gate region of a MOS transistor, a source region and a drain region located in an active area of the substrate, the source region including said first substrate area and the drain region including a silicided area, and at least a second stud adapted to be electrically conductive, passing through said isolating region and electrically coupled to the drain region and to said interconnection part, the cross sections of the first and second studs being identical within a tolerance.

Thus, in this embodiment, the decoy structure gives the appearance of being a MOS transistor, but this transistor is actually completely inoperative, since the source contact is not in electrical contact with the source region, owing to the presence of the isolating layer under the silicided sector. Furthermore, this silicided sector, viewed from above, gives the appearance of being the silicided area of the source region.

According to another possible embodiment of this variant, said first substrate area is surrounded by a first isolating domain, has an upper face, and is coupled on the side opposite this upper face to an underlying part of the substrate located under the first isolating domain.

Said first isolating layer is located above the whole of said upper surface of the first substrate area, and said silicided sector comprises a layer of metal silicide located above the whole of said first isolating layer.

Thus, according this other embodiment, the first substrate area may be, for example, a biasing area designed to bias the underlying part of the substrate. In these conditions, although this substrate area appears to be silicided when viewed from above, the substrate cannot in fact be biased by means of this bias area, because of the isolating layer placed between the upper surface of the substrate area and the silicided layer.

According to another possible variant, in which the substrate has an upper face and comprises substrate areas delimited by isolating domains, said isolating region covers the substrate areas and the isolating domains, and the decoy structure comprises, above a second substrate area, a first gate region having a first central area and a first tab, said first tab having at least a first silicided part forming said silicided sector and projecting from the first central area, parallel to the upper face of the second substrate area, towards a silicided portion of this second substrate area, a second isolating layer located between the first gate region and the upper face of the second substrate area, and a third stud adapted to be electrically conductive, passing through said isolating region, having a first end simultaneously in contact with said silicided sector and said silicided portion of said second substrate area, and a second end electrically coupled to said interconnection part.

In this variant, the third stud adapted to be electrically conductive of the decoy structure gives the appearance, when viewed from above, of being in contact with the silicided portion of the second substrate area, but is, in fact, also in contact with the first gate region via the silicided part of the tab, which is also electrically isolated from the substrate area.

Thus, there is a shared contact between the second substrate area and the first gate region.

To provide this shared contact, provision is made, in one embodiment, for the first end of the third stud adapted to be electrically conductive to comprise a first surface in electrical contact with the silicided sector, a second surface in electrical contact with the silicided portion of the second substrate area, and a break between the two surfaces.

When an element, such as a surface, is brought into electrical contact with another element, such as a silicided sector or a substrate area, an electric current is able to flow between these two elements.

This variant is particularly suitable for application to a MOS transistor.

More precisely, in this case and according to one embodiment, said decoy structure comprises: an isolated gate region of a MOS transistor, including said first gate region and said second isolating layer, a source region and a drain region located in an active area of the substrate, one of the source and drain regions including said second substrate area, and at least a fourth stud adapted to be electrically conductive, passing through said isolating region and electrically coupled to the other of the source and drain regions and to said interconnection part, the cross sections of the third and fourth studs being identical within a tolerance.

In other words, the third stud adapted to be electrically conductive is then a contact shared between the source region (or the drain region) of the MOS transistor and its gate region.

In the case where the source region contains said silicided portion, the MOS transistor of the decoy structure may then be a MOS transistor which is always closed, regardless of whether it is an NMOS transistor or a PMOS transistor.

If it is the drain region that contains the silicided portion, the MOS transistor of the decoy structure may then be a MOS transistor whose gate bias is that of the drain.

It is also particularly advantageous for the first tab to have the same width (measured perpendicularly to the source-drain direction) as the stud adapted to be electrically conductive that comes into contact with it, so that the silicided tab does not extend beyond the active area and this silicided active area does not appear, when viewed from above, as an atypical active area. Furthermore, since the cross sections of the third and fourth studs adapted to be electrically conductive, and the cross sections of all the studs (or contacts) of the integrated circuit, are identical within a manufacturing tolerance, which evidently depends on the technology used and the size of the contacts, it is particularly difficult for a third party wishing to perform reverse engineering to distinguish between a shared contact and a conventional contact, especially since the isolating layer separating the silicided sector from the substrate area is completely invisible when viewed from above.

According to another possible variant, in which the substrate has an upper face and comprises substrate areas delimited by isolating domains, said isolating region covers the substrate areas and the isolating domains, and the decoy structure comprises, above a third substrate area: a second gate region having a second central area, a third gate region having a third central area, an electrically conductive linking layer extending parallel to the upper face of the third substrate area and connecting the second central area and the third central area, this linking layer having a silicided part forming said silicided sector, and a third isolating layer located between the two gate regions, the linking layer and the upper face of the third substrate area.

The decoy structure also comprises: a first doped area located in said third substrate area under said linking layer on one side of the second central area and on one side of the third central area, a second doped area located in said third substrate area on the other side of the second central area, a third doped area located in said third substrate area on the other side of the third central area, a fifth stud adapted to be electrically conductive, passing through said isolating region, having a first end in contact with said silicided sector and a second end electrically coupled to said interconnection part, a sixth stud adapted to be electrically conductive, passing through said isolating region and electrically coupled to the second doped area and to said interconnection part, and a seventh stud adapted to be electrically conductive, passing through said isolating region and electrically coupled to the third doped area and to said interconnection part.

Thus, such a variant makes it possible to provide a decoy structure which, when viewed from above, appears to show, for example, two transistors having a common drain, but which actually leads to two transistors whose operation is disturbed because their common drain is floating.

Here again, it is particularly advantageous for the linking layer to have the same width (measured perpendicularly to the direction from the second gate to the third gate) as the stud adapted to be electrically conductive that comes into contact with it.

According to another possible variant, in which the substrate has an upper face and comprises substrate areas delimited by isolating domains, said isolating region covers the substrate areas and the isolating domains, and the decoy structure comprises, above a fourth substrate area: a fourth gate region having a fourth central area and two second electrically conductive tabs projecting, respectively, from two lateral sides of the fourth central area parallel to the upper face of the fourth substrate area, each second tab having a silicided portion, the two silicided portions forming said silicided sector, and a fourth isolating layer located between the fourth gate region and the fourth substrate area.

The decoy structure also comprises: an eighth and a ninth stud adapted to be electrically conductive, passing through said isolating region and electrically coupled, respectively, to the two silicided portions of the two second tabs and to said interconnection part.

Such a variant makes it possible to provide a decoy structure which, when viewed from above, gives the appearance of a conventional transistor, but which in fact behaves as a resistor, because source and drain contacts are not in electrical contact with the semiconductor source and drain areas, but are in electrical contact with one another via the gate region and the tabs, thus forming a resistive path.

It should be noted here that the same result may be obtained by electrically isolating the source contact of a first transistor and the drain contact of a second transistor from their source and drain semiconductor areas, and putting them into electrical contact with one another via tabs of their respective gate regions, thus forming the resistive path.

Here again, it is particularly advantageous for each second tab to have the same width (measured perpendicularly to the direction passing through these two tabs) as the respective stud adapted to be electrically conductive that comes into contact with it.

According to another possible variant, in which the substrate has an upper face and comprises substrate areas delimited by isolating domains, said isolating region covers the substrate areas and the isolating domains, and the decoy structure comprises: at least one MOS transistor located in and on a fifth substrate area and having a source region and a drain region, a fifth gate region located on the isolating domain adjacent to said fifth substrate area, said fifth gate region having a fifth central area and two third electrically conductive tabs projecting, respectively, from two lateral sides of the fifth central area parallel to the upper face of said isolating domain, each third tab having a silicided portion, the two silicided portions forming said silicided sector, the silicided portion of one of the third tabs being in electrical contact with one of the source and drain regions, and a tenth stud adapted to be electrically conductive, passing through said isolating region and electrically coupled to the silicided portion of the other third tab and to said interconnection part, and an eleventh stud adapted to be electrically conductive, passing through said isolating region and electrically coupled to the other of the source and drain regions and to said interconnection part.

Such a variant makes it possible, for example, to provide a decoy structure which, when viewed from above, gives the appearance of, for example, a NAND gate with three inputs, although one of its transistors is in fact totally inoperative because it is actually located above an isolating domain, for example a shallow trench, which gives it a very large gate oxide, thus making it inoperative.

When viewed from above, however, the decoy structure gives the impression that this gate region is located above an active area, because of the silicidation of the tabs located above the isolating domain.

According to another aspect, a method is proposed for forming, within an integrated circuit comprising a substrate, an interconnection part and an isolating region located between the substrate and the interconnection part of at least one decoy structure, the method comprising forming a silicided sector electrically isolated from the substrate, and covering the silicided sector with said isolating region.

According to a possible embodiment, the forming of the silicided sector electrically isolated from the substrate comprises: forming a first isolating layer above the whole of an upper face of a first substrate area surrounded by a first isolating domain and coupled on the side opposite this upper face to an underlying part of the substrate located under the first isolating domain, and forming a layer of metal silicide above the whole of said first isolating layer.

According to another possible embodiment, the forming of the silicided sector electrically isolated from the substrate comprises: forming an isolating layer on at least a part of the upper face of one of the substrate areas, forming, on the isolating layer, a gate region having a central area and a tab projecting from the central area, parallel to the upper face of the substrate area, and siliciding at least a part of the tab.

According to another possible embodiment, the forming of the silicided sector further comprises etching a part of the tab located between the silicided part of this tab and said central area of the gate region.

Thus this embodiment makes it possible to "section" a tab so as to form a silicided sector enabling the source contact, for example, to be isolated from the substrate.

According to another possible embodiment, the forming of the silicided sector electrically isolated from the substrate comprises: forming an isolating layer on at least a part of the upper face of one of the substrate areas, forming, on the isolating layer, two gate regions and an electrically conductive linking layer extending parallel to the upper face of the substrate area and connecting the two gate regions, and siliciding a part of this linking layer.

According to another possible embodiment, the forming of the silicided sector electrically isolated from the substrate comprises: forming an isolating layer on at least a part of the upper face of one of the substrate areas, forming, on the isolating layer, a gate region having a central area and two electrically conductive tabs projecting, respectively, from two lateral sides of the central area, parallel to the upper face of the substrate area, and siliciding at least a part of each tab.

According to another possible embodiment, the forming of the silicided sector electrically isolated from the substrate comprises: forming a gate region on an isolating domain adjacent to a substrate area, said gate region having a central area and two electrically conductive tabs projecting, respectively, from two lateral sides of the central area, parallel to the upper face of said isolating domain, and siliciding a portion of each tab, the silicided portion of one of the tabs being in electrical contact with a silicided area of the substrate area.

Regardless of which of the aforementioned embodiments is used, the method may also advantageously comprise the forming, in said isolating region, of at least one stud adapted to be electrically conductive, electrically coupled to the silicided sector and to said interconnection part.

BRIEF DESCRIPTION OF THE DRAWINGS

Other advantages and features of the invention will be apparent from a perusal of the detailed description of applications and embodiments which are not limiting in any way, and the appended drawings, in which.

DETAILED DESCRIPTION OF THE DRAWINGS

Figure 1:
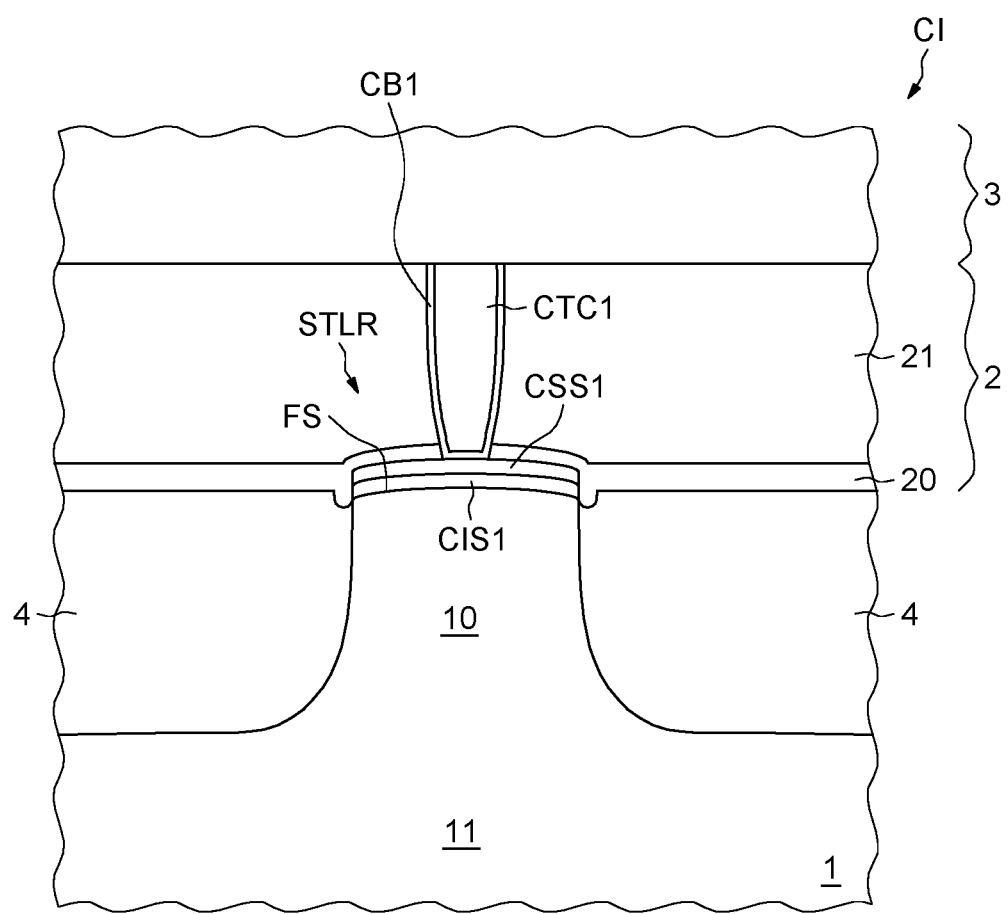
FIG. 1 illustrates a first embodiment of an integrated circuit incorporating a decoy structure.

Reference will now be made to FIG. 1, to illustrate a first embodiment of an integrated circuit CI, incorporating a decoy structure STLR.

In this figure, the reference 1 denotes a semi-conductive substrate, of silicon for example. This substrate may be a solid substrate or a box structure, or alternatively a semi-conductive film of a substrate of the silicon on insulator (SOI) type.

In this example, the substrate 1 comprises a substrate area 10 surrounded by an isolating domain 4, typically a shallow trench (STI: Shallow Trench Isolation).

In a conventional integrated circuit, this substrate area 10 is intended to bias, by means of a bias voltage delivered through an electrically conductive stud CTC1, commonly known to those skilled in the art by the term "contact", the underlying part 11 of the substrate located, notably, under the isolating domain 4.

As is conventional in this field, the integrated circuit comprises, above the substrate, an isolating region 2 which conventionally comprises a layer 20, typically of silicon nitride, also known to those skilled in the art by the term "CESL" (Contact Etch Stop Layer). The isolating region 2 further comprises, above the layer 20, a layer 21 comprising a dielectric material commonly known to those skilled in the art by the term "PMD (Pre-Metal Dielectric) material".

Above the isolating region 2 lies the interconnection part 3 of the integrated circuit, commonly known to those skilled in the art by the English term BEOL (Back End Of Line), which comprises metal tracks and vias within different levels of metal and vias.

In this case, the decoy structure STLR comprises a first isolating layer CIS1 covering the whole of the upper face FS of the substrate area 10, this upper face also being the upper face of the substrate and the upper face of the isolating domains 4.

Above the whole of this first isolating layer CIS1, the decoy structure STLR comprises a silicided layer CSS1, that is to say a layer comprising a metal silicide.

The forming of the first isolating layer CIS1 is conventional and is carried out, for example, by thermal oxidation of the substrate area 10.

As regards the forming of the silicided layer CSS1, which forms the silicided sector of the structure STLR, this is carried out conventionally by polysilicon layer deposition, metal deposition, and thermal annealing.

The contact CTC1, comprising in a conventional way a barrier layer CB1, passes through the isolating region 2 and is electrically coupled to both the silicided sector CSS1 and the interconnection part 3.

Thus, when viewed from above, the decoy structure STLR gives the impression that there is a substrate area 10 capable of biasing the underlying portion 11 of the substrate 1. In fact, however, this is impossible, because of the first isolating layer CIS1 located under the layer CSS1 and invisible from above.

Figure 2:
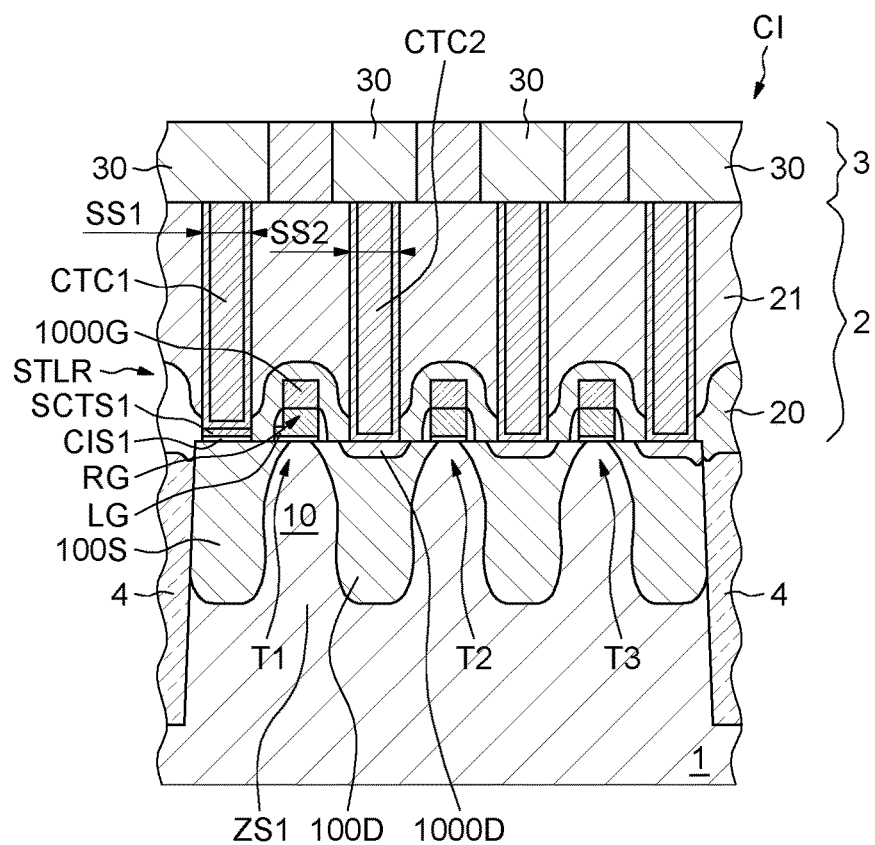
FIGS. 2 and 3 illustrate another possible embodiment of a decoy structure STLR within an integrated circuit.
Figure 3:
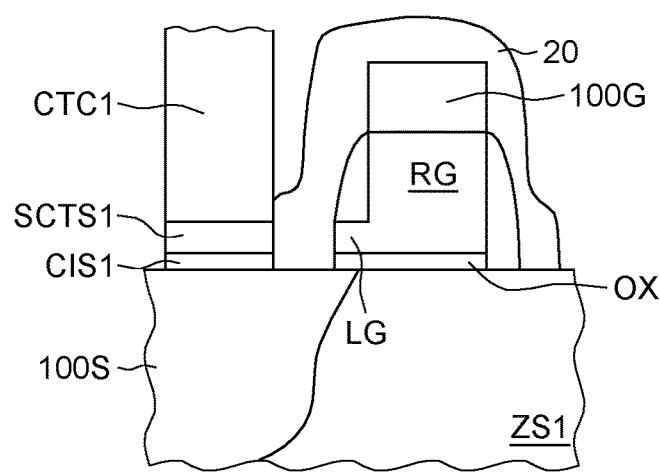

Reference will now be made more particularly to FIGS. 2 and 3, to illustrate another possible embodiment of a decoy structure STLR within an integrated circuit CI.

In these figures, elements similar or functionally similar to those illustrated in FIG. 1 have references identical to those that they had in FIG. 1.

Thus, once again, there is an isolating region 2 surmounted by the interconnection part 3, in which some metal tracks 30 are shown schematically.

In this case, the decoy structure STLR comprises an isolated gate region RG of a MOS transistor T1, a source region 100S and a drain region 100D located in an active area ZS1 of the substrate 1, delimited by an isolating domain 4.

As shown more particularly in FIG. 3, the gate region RG of the MOS transistor T1 is isolated from the active area ZS1 by a gate oxide OX and comprises a piece of tab LG at its base. As described in more detail below, this tab LG has been used to form, by sectioning and siliciding, the silicided sector STCS1 which is isolated from the source region 100S by the first isolating layer CIS1.

The silicided sector STCS1 is electrically isolated from the gate region RG by the isolating layer 20.

Additionally, the first electrically conductive stud or contact CTC1 comes into electrical contact with the silicided sector SCTS1, through the isolating region 2.

Additionally, as shown more particularly in FIG. 2, the cross section SS1 of the first stud CTC1 and the cross section SS2 of a second stud CTC2, coming into contact with the drain region of the MOS transistor T1 in this case, are identical within a manufacturing tolerance, which evidently depends on the technology used and the desired size of the contacts.

It can also be seen in FIG. 2 that in this case the integrated circuit CI comprises a second MOS transistor T2 and a third MOS transistor T3, in addition to the MOS transistor T1.

The cross sections of all the contacts passing through the isolating region are identical within the tolerance.

For the purpose of simplifying the drawings, the conductive studs that contact the gate regions, and notably the one that contacts the silicided region 100G of the gate region RG of the MOS transistor T1 are not shown.

Thus, when viewed from above, the decoy structure STLR resembles a MOS transistor, namely the MOS transistor T1. However, this transistor is in fact totally inoperative because it has no source contact, given that the stud CTC1 is electrically isolated from the source region 100S by the first isolating layer CIS1.

Furthermore, the silicided sector SCTS1 appears, when viewed from above, to be a silicided area of the source region.

Figure 4:
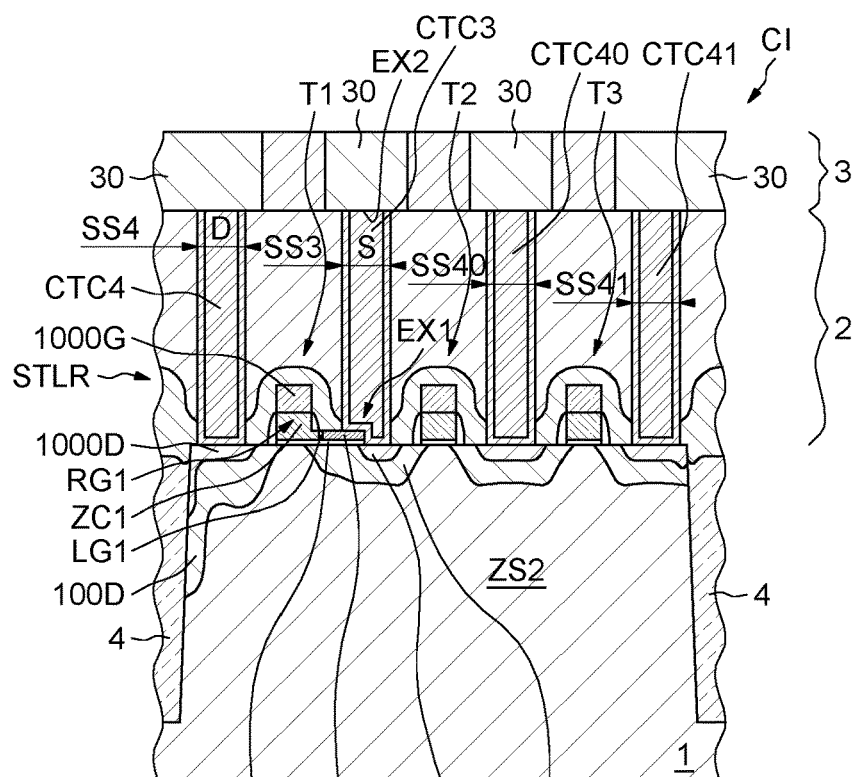
FIGS. 4-6 illustrate schematically other possible variants of a decoy structure formed within an integrated circuit in particular for PMOS and NMOS transistors.
Figure 5:
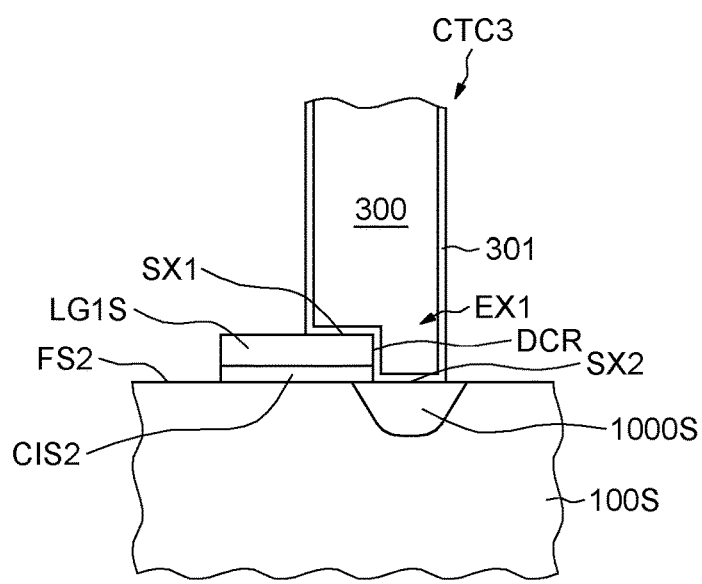

FIGS. 4 and 5 illustrate schematically another possible variant of a decoy structure STLR formed within an integrated circuit CI.

Here again, in these figures, elements similar or functionally similar to those described previously have the same references.

In this variant, the decoy structure STLR comprises, above a second region ZS2 of the substrate 1, a first gate region RG1 having a first central area, typically made of polysilicon, and a first tab LG1.

This first tab comprises a first silicided part LG1S forming the silicided sector of the decoy structure and projecting from the first central area RG1, parallel to the upper face FS2 of the second substrate area, towards a silicided portion 1000S of this second substrate area.

In the example described here, this silicided portion 1000S is the silicided portion of the source region 100S of the MOS transistor T1 comprising the first gate region RG1.

In addition to a source region 100S, the MOS transistor T1 comprises a drain region 100D which also has a silicided portion 1000D.

The first gate region RG1 also has a silicided portion 1000G in its upper part.

The decoy structure STLR further comprises a second isolating layer CIS2 located between the first gate region and the upper face FS2 of the second substrate area ZS2.

This second isolating layer CIS2 isolates not only the first central area ZC1 of the first gate region RG1, but also the first tab LG1 and in particular its first silicided part LG1S, from the substrate area.

This first isolating layer is totally invisible when viewed from above, because it is concealed by the tab and the isolating region 2.

In this case the decoy structure comprises a third electrically conductive stud CTC3, passing through the isolating region 2 and having a first end EX1 simultaneously in contact with the silicided sector LG1S and the silicided portion 1000S of the source region 100S.

The third stud CTC3 also has a second end EX2 electrically coupled to the interconnection part 3 of the integrated circuit CI.

Thus, in this case there is a contact shared between the source region 100S of the MOS transistor T1 and its gate region via the first tab, which is totally invisible when viewed from above because it is embedded in the isolating region 2 and located partially under the contact CTC3.

In this example, the integrated circuit further comprises two other MOS transistors T2 and T3, and the cross section SS3 of the third stud CTC3, the cross section SS4 of the fourth stud CTC4 which comes into contact with the drain region 100D, together with the cross sections SS40 and SS41 of the electrically conductive studs CTC40 and CTC41 associated with the MOS transistors T2 and T3, are once again identical within a tolerance.

As may be seen in greater detail in FIG. 5, the first end EX1 of the stud CTC3 comprises a first surface SX1 in electrical contact with the silicided sector SG1S, a second surface SX2 in electrical contact with the silicided portion 1000S of the source region 100S, and a break DCR between the two surfaces.

Thus, when viewed from above, the decoy structure STLR resembles a MOS transistor, in this case a PMOS transistor, for example. However, because of the presence of the shared contact CTC3, the gate of the PMOS transistor is electrically connected to its source S, as shown schematically at the foot of FIG. 4. Consequently the PMOS transistor is always closed (the contact CTC3 is intended to be connected to the supply voltage), although, when viewed from above, it appears to be a conventional PMOS transistor.

Figure 6:
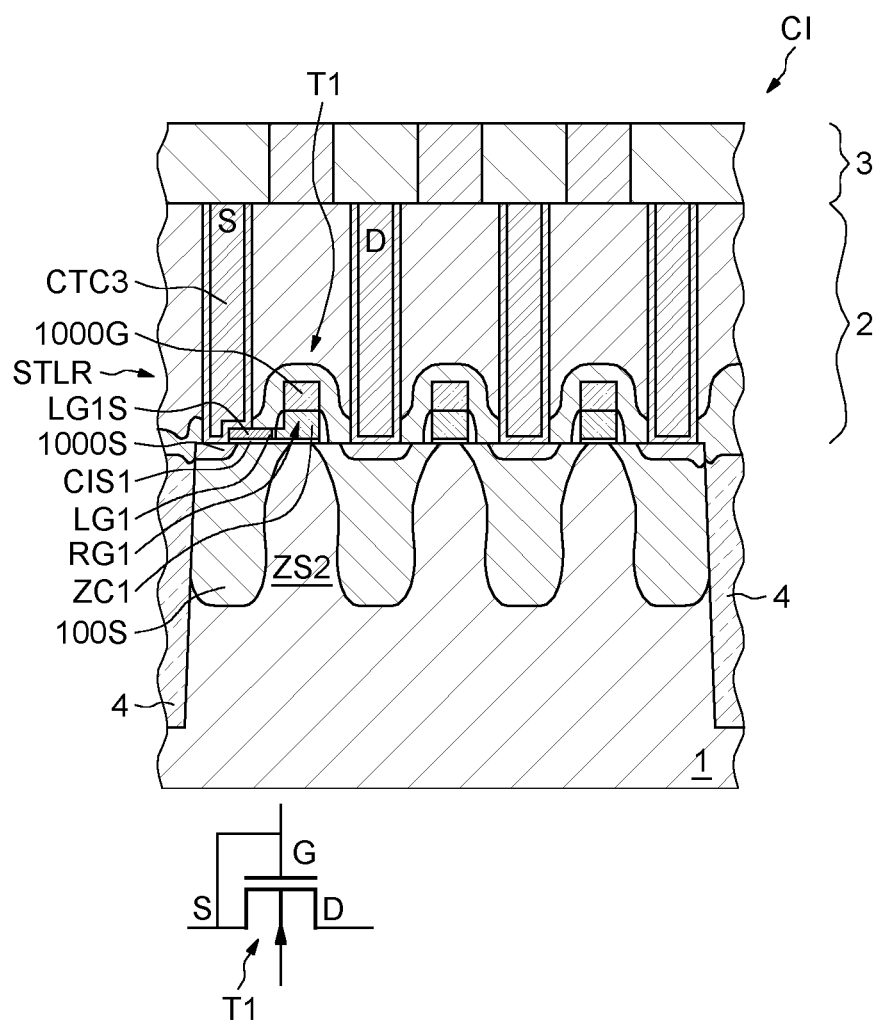

Although the MOS transistor T1 is a PMOS transistor in FIGS. 4 and 5, it is entirely possible, as shown in FIG. 6, for the MOS transistor T1 to be an NMOS transistor.

This FIG. 6 shows the first gate region RG1 comprising the first tab LG1 which has the silicided part LG1S. Here again, the electrically conductive stud CTC3 is a contact shared between the silicided portion 1000S of the source region 100S and the silicided portion LG1S electrically coupled to the gate region RG1.

Consequently, in this variant, the transistor T1, when viewed from above, appears to be a conventional NMOS transistor, but is in fact an NMOS transistor which is always closed, because, owing to the presence of the shared contact CTC3 between the source and the gate, these two source and gate regions are electrically connected, and the contact CTC3 is intended to be connected to earth in this case.

Figure 7:
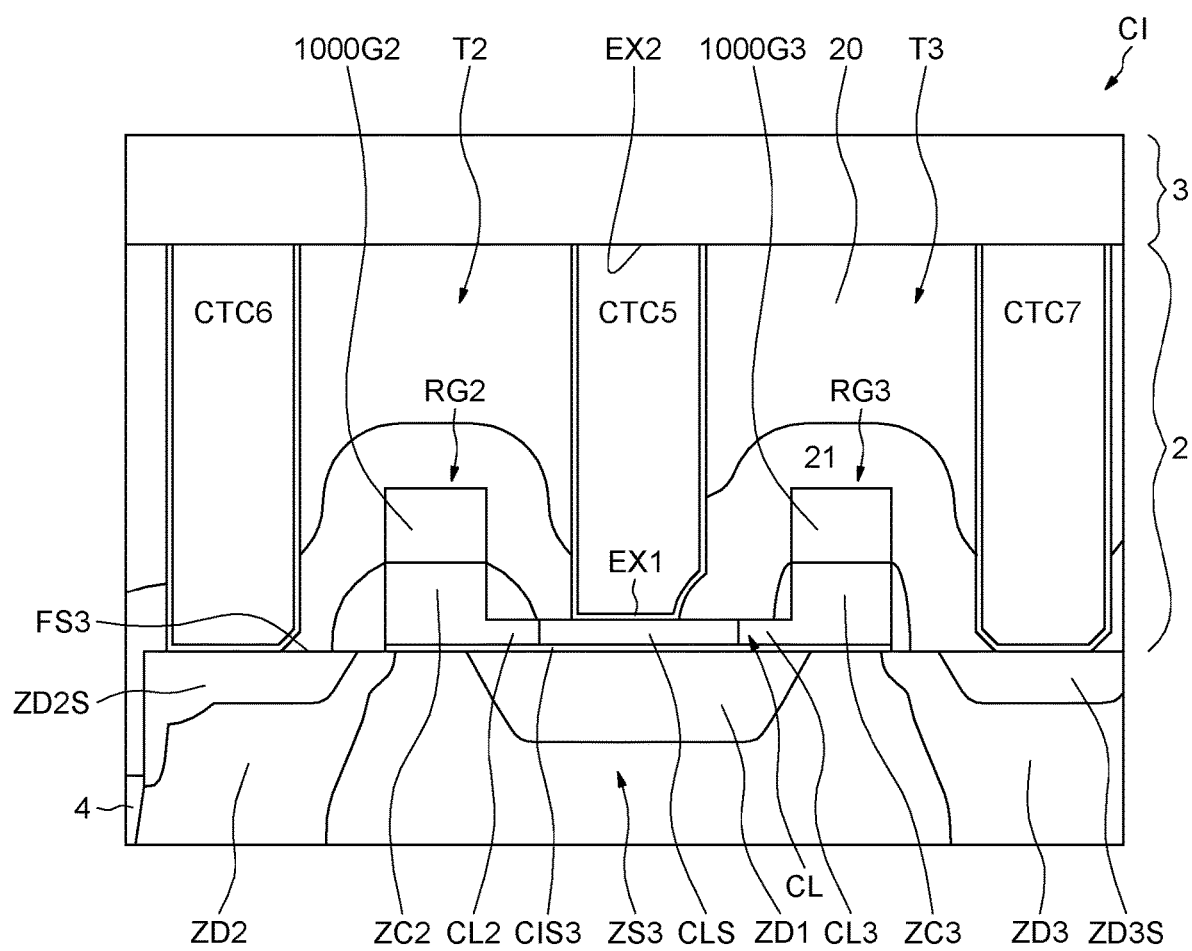
FIG. 7 illustrates schematically another possible variant of the decoy structure.

FIG. 7 illustrates schematically another possible variant of the decoy structure STLR.

Here again, elements similar or functionally similar to those described previously have the same references.

In this case, the silicided sector of the decoy structure STLR comprises a silicided part CLS of a linking layer CL extending parallel to the upper face FS3 of a third substrate area ZS3 and connecting a second central area ZC2 of a second gate region RG2 with a third central area ZC3 of a third gate region RG3.

The central areas ZC2 and ZC3 are also made of polysilicon, as is the linking layer CL, except of course for its silicided part CLS which comprises a metal silicide.

The decoy structure STLR also comprises a third isolating layer CIS3, made of silicon dioxide for example, located between the gate regions RF2, RG3, the linking layer CL and the substrate area ZS3.

The decoy structure STLR also comprises, within the third substrate area, a first doped area ZD1 located under the linking layer CL on one side of the second central area ZC2 and on one side of the third central area ZC3.

The decoy structure STLR also comprises a second doped area ZD2, located in the third substrate area ZS3 on the other side of the second central area ZC2, and a third doped area ZD3, also located in the third substrate area ZS3, on the other side of the third central area ZC3.

The second and third gate regions RG2 and RG3 comprise, respectively, silicided portions 1000G2 and 1000G3 in their upper parts.

Similarly, the second and third doped areas ZD2 and ZD3 comprise, respectively, silicided regions ZD2S and ZD3S.

The decoy structure also comprises a fifth electrically conductive stud CTC5, passing through the isolating region 2 and having a first end EX1 in contact with the silicided sector of the decoy structure STLR, that is to say with the silicided part CLS of the linking layer CL, and a second end EX2 electrically coupled to the interconnection part 3.

A sixth electrically conductive stud CTC6 is also provided, passing through the isolating region 2, and electrically coupled to the second doped area ZD2 via the silicided region ZD2S, and also to the interconnection part 3.

The decoy structure STLR also comprises a seventh semiconductor stud CTC7 passing through the isolating region 2, and electrically coupled to the third doped area ZD3 via the silicided region ZD3S, and electrically coupled to the interconnection part 3.

Thus, when viewed from above, the decoy structure STLR may resemble two MOS transistors T2 and T3, whose drains are electrically connected via the stud CTC5.

In fact, however, the drains of these transistors are floating, because of the presence of the third isolating layer CIS3 under the linking layer CL and in particular under its silicided part CLS.

Figure 8:
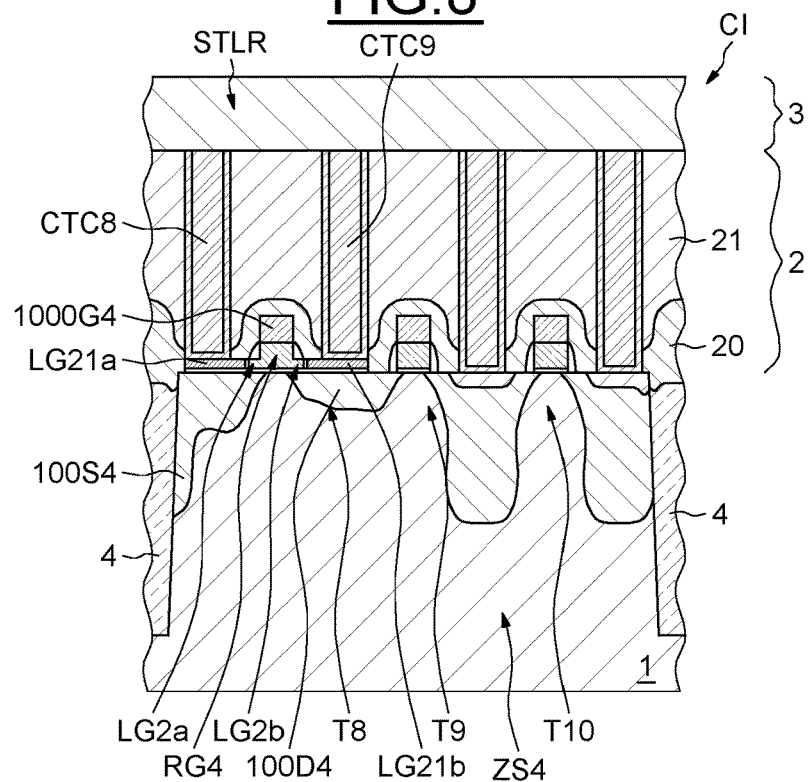
FIGS. 8-10 illustrate another possible variant of the decoy structure within the integrated circuit.
Figure 9:
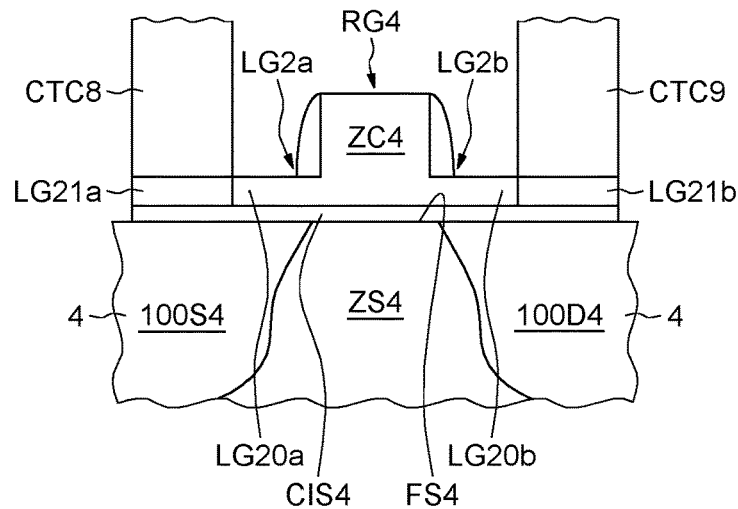
Figure 10:
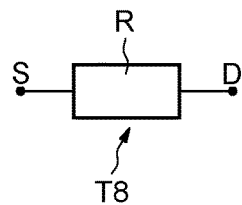

Reference will now be made more particularly to FIGS. 8 and 10, to illustrate another possible variant of the decoy structure STLR within the integrated circuit CI.

In this case, the decoy structure STLR comprises, above a fourth substrate area ZS4, a fourth gate region RG4 having a fourth central area ZC4 and two second tabs LG2a and LG2b projecting, respectively, from two lateral sides of the fourth central area ZC4 parallel to the upper face FS4 of the fourth substrate area ZS4.

Each second tab LG2a, LG2b has a silicided portion LG21a and LG21b.

Each tab LG2a and LG2b has two non-silicided portions LG20a and LG20b located between the central area ZC4 and the respective silicided portions LG21a and LG21b.

The decoy structure STLR further comprises a fourth isolating layer CIS4 located between the gate region RG4 and the fourth substrate area ZS4.

Thus the gate region RG4, including the central area ZC4 and the two tabs LG2a and LG2b, is electrically isolated from the substrate area ZS4.

The decoy structure further comprises a doped region, for example a source region 100S4, under the silicided portion LG21a, and another doped region, for example a drain region, 100D4, under the silicided portion LG21b.

The decoy structure STLR further comprises an eighth and a ninth electrically conductive stud CTC8, CTC9, passing through the isolating region 2 and electrically coupled, respectively, to the two silicided portions LG21a and LG21b of the second tabs LG2a and LG2b, as well as to said interconnection part 3.

The integrated circuit CI further comprises, in this example, a MOS transistor T9 and a MOS transistor T10.

Thus, when viewed from above, the decoy structure appears to be a MOS transistor T8. In fact, however, this transistor T8 behaves as a resistor R (FIG. 10) whose resistive path extends from the silicided portion LG21a to the silicided portion LG21b, passing through the central area ZC4 of the gate region RG4.

As for the transistor T9, this is in fact a totally inoperative transistor, since its drain contact does not exist.

Figure 11:
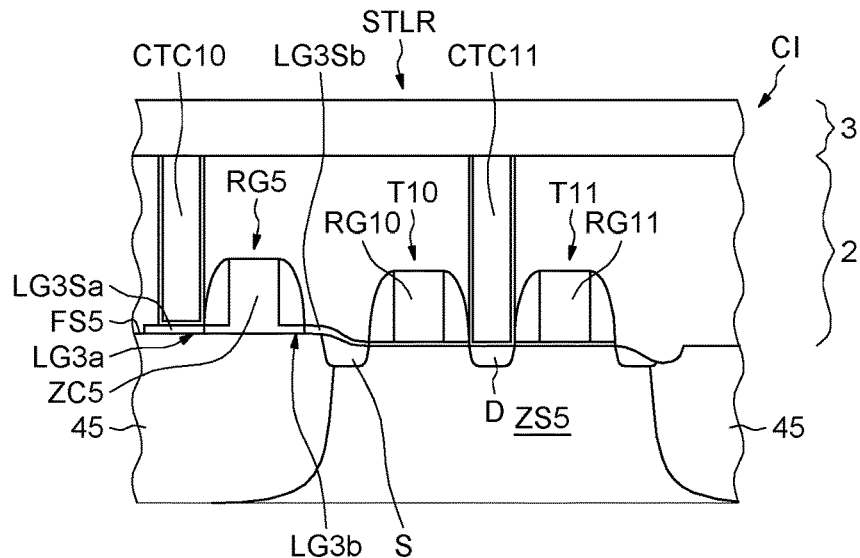
FIGS. 11-13 illustrate schematically another possible variant embodiment of a decoy structure within the integrated circuit.
Figure 13:
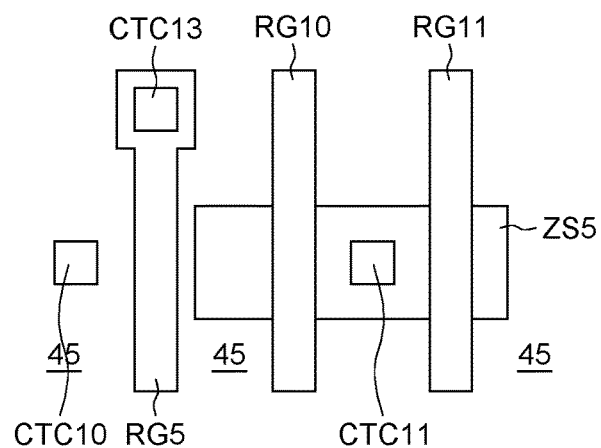

Reference will now be made more particularly to FIGS. 11 and 13, to illustrate schematically another possible variant embodiment of a decoy structure STLR within the integrated circuit CI.

In this variant, the decoy structure STLR comprises at least one MOS transistor T10 located in and on a fifth substrate area ZS5 and having a source region S and a drain region D.

The decoy structure STLR further comprises a fifth gate region RG5 located on the isolating domain 45, of the shallow trench type for example, adjacent to the fifth substrate area ZS5.

This gate region RG5 has a fifth central area ZC5 and two third tabs LG3a and LG3b projecting, respectively, from two lateral sides of the fifth central area ZC5 parallel to the upper face SS5 of the isolating domain 45.

Each third tab LG3a, LG3b has a silicided portion LG3Sa and LG3Sb.

The two silicided portions LG3 Sa and LG3 Sb form the silicided sector of the decoy structure STLR.

In this case, the silicided portion LG3Sb of the third tab LG3b is in electrical contact with the source region of the MOS transistor T10.

The decoy structure STLR further comprises a tenth electrically conductive stud CTC10, passing through the isolating region 2 and electrically coupled to the silicided portion LG3Sa of the other third tab LG3a, as well as to the interconnection part 3.

The decoy structure STLR also comprises another MOS transistor T11 having a gate region RG11 located in and on the fifth substrate ZS5.

An eleventh electrically conductive stud CTC11 passes through the isolating region 2 and is in electrical contact, on the one hand, with the interconnection part 3, and, on the other hand, with the drain region common to the two transistors T10 and T11.

Figure 12:
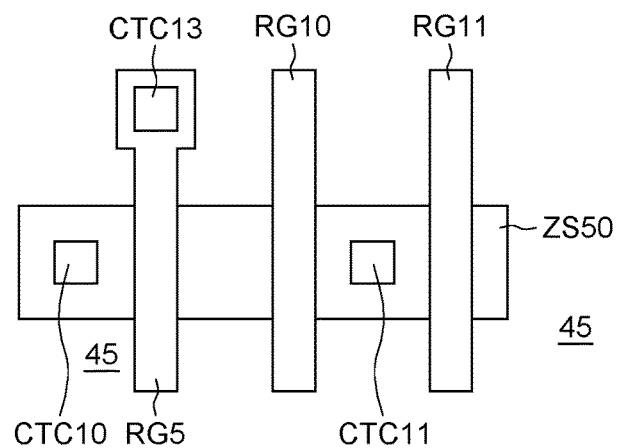

FIG. 12 shows the apparent system of arrangement ("layout") of this decoy structure STLR.

Because of the presence of the silicided portions of the tabs, the decoy structure gives the appearance of an active area ZS50 which extends beyond the substrate area ZS5 and which is apparently surrounded by the isolating domain 45.

The contact point CTC10 and the contact point CTC11 are again present in this active area.

The gate regions RG5, RG10 and RG11 are also present again, with a contact CTC13 on the gate region RG5.

Thus, the decoy structure STLR, when viewed from above, appears to be, for example, a three-input NAND gate.

The actual system of arrangement ("layout") of this structure is shown in FIG. 13. In fact, the transistor having the gate region RG5 is a totally inoperative transistor, because its gate oxide is formed by the isolating domain 45, whose thickness, typically about 400 nm, is much too great for it to operate.

The contact CTC10 is also totally isolated from the substrate area underlying the isolating domain 45.

And the active area is effectively limited to the substrate area ZS5 only.

Therefore this structure is definitely not a three-input NAND gate.

Figure 14:
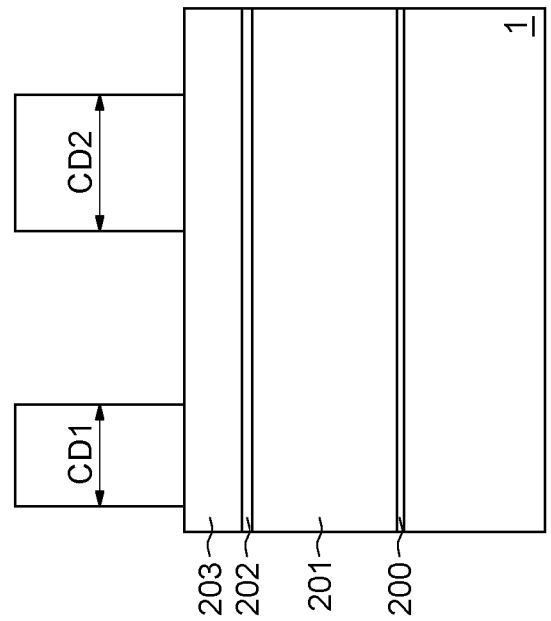
Figure 19:
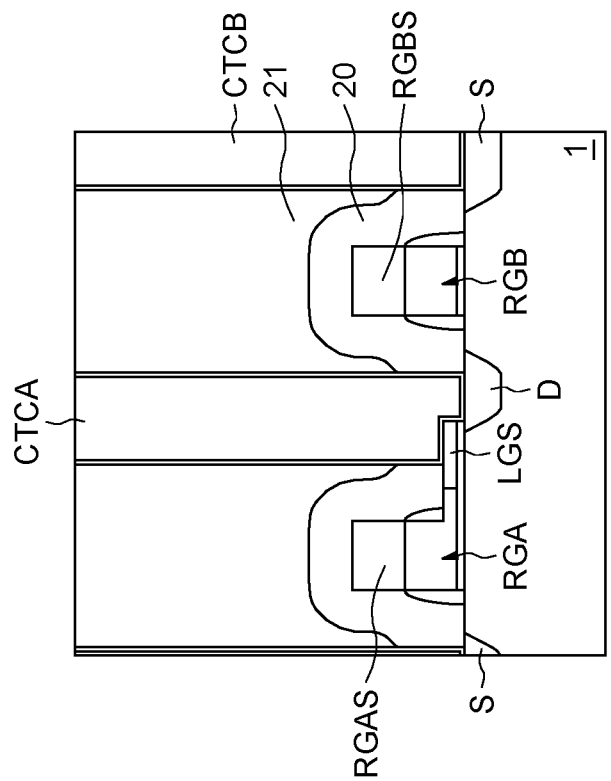

Reference will now be made more particularly to FIGS. 14 and 19, to illustrate an example of a method for manufacturing a decoy structure STLR, and more particularly for forming an isolated shared contact of this decoy structure STLR.

In a first step, shown in FIG. 14, an isolating layer 200, of silicon dioxide for example, is formed in a conventional and known way on a semiconductor substrate 1, and a layer 201 of gate material, for example polysilicon, is then formed on this isolating layer 200, and is covered in a conventional way by a hard mask layer 202, of silicon nitride for example.

Figure 15:
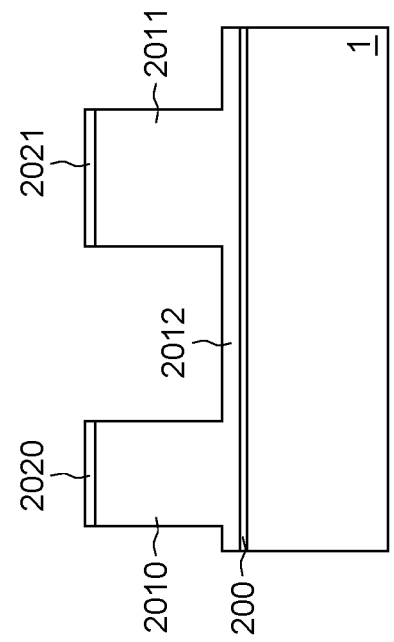
FIGS. 14-19 illustrate an example of a method for manufacturing a decoy structure.

The hard mask layer and then the polysilicon layer 201 are then etched in a conventional and known way, using a layer of resin 203 exposed and developed in a photolithography step with the aid of a mask having a first aperture CD1 and a second aperture CD2, so as to form the structure shown in FIG. 15.

In this FIG. 15, on completion of this etching, and notably the partial etching in time of the polysilicon layer, two polysilicon blocks 2010 and 2011 are obtained, each surmounted by a residual hard mask layer 2020 and 2021.

On either side of these two blocks 2010 and 2011, the etching operation has produced a residual polysilicon layer 2012, with a thickness of 10 nanometers, for example.

Figure 16:
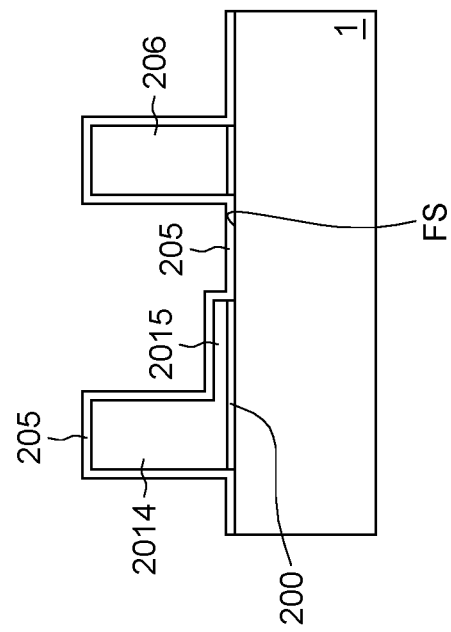
Figure 17:
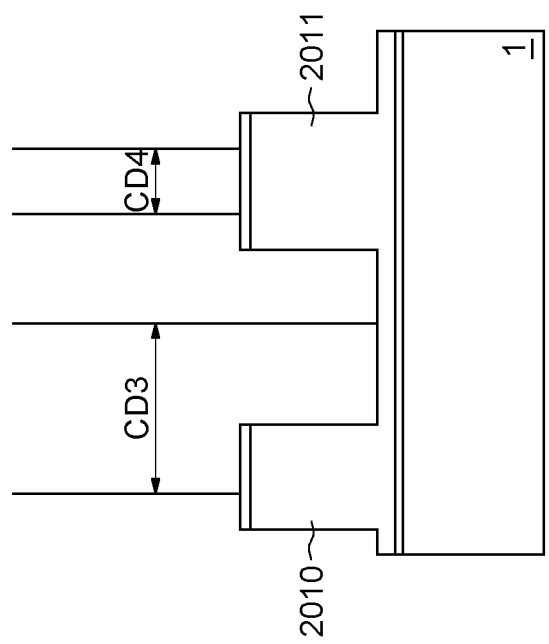

As shown in FIG. 16, the blocks 2010 and 2011 are then etched, using another layer of resin and another etching mask having an aperture CD3 and an aperture CD4, to produce, as shown in FIG. 17, a first polysilicon block 2014 and a second polysilicon block 206 of the same size, for example 40 nanometers, together with a polysilicon tab 2015 projecting at the base of the block 2014, parallel to the upper surface SS of the substrate 1.

The block 2014, the tab 2015 and the block 206 are isolated from the substrate by the residual isolating layer 200.

This structure is then covered with another isolating layer 205, of silicon dioxide for example.

Figure 18:
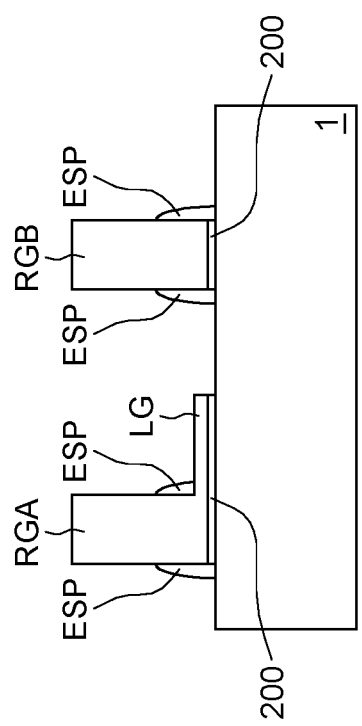

Then, as shown in FIG. 18, isolating lateral regions or spacers ESP are formed in a conventional and known way on the sides of the blocks 205 and 206, and the isolating layer 200 is removed from either side of the gate region RGA and the gate region RGB formed in this way.

The residual portion 2015 of polysilicon thus forms the tab LG which is isolated from the substrate by the isolating layer 200.

As shown in FIG. 19, the portion of the tab not protected by the spacer is then silicided in a conventional and known way, so as to produce a silicided tab portion LGS. The source and drain regions S and D of the transistors are then also silicided, as are the upper parts RGAS and RGBS of the gate regions RGA and RGB.

The whole of the isolating region 2, comprising the layer 20 and the layer 21 which is a PBD (Pre-Metal Dielectric) layer, is covered, and the electrically conductive stud or contacts CTCA and CTCB are formed in a conventional and known way by etching and filling with metal, for example tungsten.

The stud CTCA is then a contact shared between the drain region D and the gate region RGA, via the silicided portion LGS of the tab LG.

In fact, as may be seen here, it is the residual portion 2012 of the polysilicon layer that makes it possible to form the different silicided sectors of the different decoy structures of the different embodiments described above.

Thus, if a silicided linking layer is to be formed, as shown in FIG. 7, the portion 2012 of polysilicon is allowed to remain between the two gate blocks.

If two tabs are to be formed, on either side of the gate region, the etching mask is adjusted accordingly.

Also, if a substrate area is to be silicided as shown in FIG. 1, the residual portion 2012 of polysilicon is allowed to remain on the isolating layer covering the substrate area, and is then etched so as to cover the whole of the surface of the isolating layer covering the corresponding substrate area.

Finally, if the silicided sector SCTS1 of FIG. 2 is to be formed, a part of the layer 2012 is totally etched so as to form a sectioned tab.

Evidently, the values CD1, CD2, CD3 and CD4 will be adjusted according to the desired size of the central areas of the gate regions and the desired lengths of the tabs.

The invention claimed is:

1. An integrated circuit, comprising:
a substrate having an upper face and including a substrate area;
an interconnection part;
an isolating region located between the substrate and the interconnection part; and
a decoy structure located within said isolating region;
wherein said decoy structure comprises:
  a first gate region having a first central area;
  a second gate region having a second central area;
  an electrically conductive linking layer extending parallel to the upper face and connecting the first central area and the second central area;
  an isolating layer extending on the substrate under the first gate region, the second gate region and the electrically conductive linking layer between the first and second gate regions;
  wherein said electrically conductive linking layer includes a silicided part;
  wherein said substrate area includes:
    a common doped drain area located under the silicided part of said electrically conductive linking layer and positioned between the first and second gate regions;
    a first doped source area located on an opposite side of the first gate region from the common doped drain area; and
    a second doped source area located on an opposite side of the second gate region from the common doped drain area;
  a first electrically conductive contact passing through said isolating region, having a first end in contact with said silicided part and a second end electrically coupled to said interconnection part,
  a second electrically conductive contact passing through said isolating region and electrically coupled to the first doped source area and to said interconnection part, and
  a third electrically conductive contact passing through said isolating region and electrically coupled to the second doped source area and to said interconnection part.

2. The integrated circuit according to claim 1, wherein the linking layer has a same width as the first electrically conductive contact.

3. The integrated circuit according to claim 1, wherein said first gate region, second gate region and electrically conductive linking layer are made of polysilicon.

4. The integrated circuit according to claim 1, wherein said common doped drain area provides a floating drain that is electrically isolated from the first electrically conductive contact by said isolating layer.

5. The integrated circuit according to claim 1, further comprising a sidewall spacer on a lateral side of the first gate region, wherein said sidewall spacer covers a non-silicided part of said electrically conductive linking layer.

6. The integrated circuit according to claim 1, wherein said first doped source area includes a silicided part and said second electrically conductive contact is electrically connected to said silicided part of the first doped source area.

7. The integrated circuit according to claim 1, wherein said second doped source area includes a silicided part and said third electrically conductive contact is electrically connected to said silicided part of the second doped source area.

8. An integrated circuit, comprising:
a substrate having an upper face and including a substrate area with a first doped region, a second doped region and a third doped region;
an interconnection part;
an isolating region located between the substrate and the interconnection part; and
a decoy structure located within said isolating region;
wherein said decoy structure comprises:
  a first gate region positioned over the substrate between the first and second doped regions;
  a second gate region positioned over the substrate between the first and third doped regions;
  an electrically conductive linking layer extending parallel to the upper face, over the first doped region and electrically connecting the first and second gate regions;
  an isolating layer extending on the substrate under the first gate region, the second gate region and the electrically conductive linking layer between the first and second gate regions;
  a first electrically conductive contact passing through said isolating region, having a first end in contact with said electrically conductive linking layer and a second end electrically coupled to said interconnection part,
  a second electrically conductive contact passing through said isolating region and electrically coupled to the second doped region and to said interconnection part, and
  a third electrically conductive contact passing through said isolating region and electrically coupled to the third doped region and to said interconnection part.

9. The integrated circuit according to claim 8, wherein the first doped region forms a common drain region, and the second and third doped regions form source regions.

10. The integrated circuit according to claim 8, wherein said electrically conductive linking layer includes a silicided part, and wherein said first electrically conductive contact is electrically connected to said silicided part.

11. The integrated circuit according to claim 8, wherein the linking layer has a same width as the first electrically conductive contact.

12. The integrated circuit according to claim 8, wherein said first gate region, second gate region and electrically conductive linking layer are made of polysilicon.

13. The integrated circuit according to claim 8, wherein said first doped region is a floating region that is electrically isolated from the first electrically conductive contact by said isolating layer.

14. The integrated circuit according to claim 8, wherein said second doped region includes a silicided part and said second electrically conductive contact is electrically connected to said silicided part of the second doped region.

15. The integrated circuit according to claim 8, wherein said third doped region includes a silicided part and said third electrically conductive contact is electrically connected to said silicided part of the third doped region.

* * * * *